United States Patent
Balm et al.

(10) Patent No.: US 6,924,706 B2
(45) Date of Patent: Aug. 2, 2005

(54) PHASE LOCKED LOOP

(75) Inventors: Bart Balm, Meerbusch-Lank (DE); Walter Mevissen, Düsseldorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/705,521

(22) Filed: Nov. 10, 2003

(65) Prior Publication Data

US 2004/0100311 A1 May 27, 2004

Related U.S. Application Data

(63) Continuation of application No. PCT/DE02/01674, filed on May 8, 2002.

(30) Foreign Application Priority Data

May 8, 2001 (DE) .......................................... 101 22 194

(51) Int. Cl.$^7$ ................................................ H03L 7/00
(52) U.S. Cl. .............................. 331/17; 331/16; 331/34; 331/177 V; 331/36 C
(58) Field of Search .......................... 331/36 C, 177 V, 331/179, 34, 117 R, 117 FE, 167, 16, 17, 177 R

(56) References Cited

U.S. PATENT DOCUMENTS

| 4,074,209 A | * | 2/1978 | Lysobey ..................... 332/128 |
| 5,379,002 A | | 1/1995 | Jokura ........................... 331/10 |
| 5,557,242 A | | 9/1996 | Wetherell ..................... 331/17 |
| 5,625,325 A | | 4/1997 | Rotzoll ......................... 331/16 |

FOREIGN PATENT DOCUMENTS

| DE | 199 38 515 A1 | 3/2001 |
| EP | 0 412 491 A2 | 2/1991 |
| GB | 2 282 285 A | 3/1995 |
| JP | 57160227 | 10/1982 |
| WO | 89/06456 | 7/1989 |

* cited by examiner

Primary Examiner—Arnold Kinkead
(74) Attorney, Agent, or Firm—Laurence A. Greenberg; Werner H. Stemer; Ralph E. Locher

(57) ABSTRACT

A phase locked loop has a voltage controlled oscillator with two tuning inputs. One tuning input can be supplied with a feedback signal via a frequency divider in a conventional phase locked loop. A frequency word, which is provided anyway for the purpose of setting the division ratio of the PLL and hence for the purpose of frequency preselection, is used not only to supply the frequency divider but also for compensatory tuning of frequency-determining components in the oscillator. The phase locked loop allows, particularly in inexpensive open loop modulation methods, a significant reduction in the frequency drift by virtue of a smaller or disappearing discrepancy in the tuning voltage in conjunction with a reduction in the memory effect of capacitors in loop filters using particularly simple circuitry measures.

7 Claims, 1 Drawing Sheet

PHASE LOCKED LOOP

CROSS-REFERENCE TO RELATED APPLICATION

This application is a continuation of copending International Application No. PCT/DE02/01674, filed May 8, 2002, which designated the United States and which was not published in English.

BACKGROUND OF THE INVENTION

Field of the Invention

The present invention relates to a phase locked loop.

Phase locked loops (PLLs) are used, by way of example, in transmission and reception units in mobile radio.

In order to provide multiple access for a plurality of subscribers on a common base station and in order to provide systems which have full-duplex capability, firstly transmission and reception in timeslots and secondly a frequency hopping method can be used.

To allow simple modulation at the same time, "open loop methods" can be used, which allow direct modulation, on-frequency modulation, directly in the phase locked loop or directly in the voltage controlled oscillator in the phase locked loop. This involves the feedback of the phase locked loop being lifted during the modulation, that is to say during a transmission timeslot. In order to be able to lock onto a new carrier frequency or onto a new channel, the phase locked loop's feedback is then restored and hence the control loop is once more closed.

During the open mode of the phase locked loop, however, the problem can arise that the carrier frequency onto which the PLL has locked is subject to time-dependent drifts. These drifts can be caused, by way of example, by a change in the tuning voltage of the loop filter in the PLL. Since the size and the direction of such drifts is dependent on the previously used frequency of the phase locked loop, this drift is often referred to as "memory effect."

One of the main causes of such a memory effect is the dielectric absorption of the PLL loop filter capacitors in conjunction with the change in the tuning voltage upon a change of channel. The tuning voltage, which is applied to the input side of the voltage controlled oscillator in a frequency locked loop, is normally equal to the voltage across loop filter capacitors in the control loop, which ensure stable control inter alia. The dielectric absorption of the capacitor dielectric, the "capacitor soakage," is an effect which is originally known from high-voltage technology. Capacitors with an oilpaper dielectric which have been discharged by short circuiting, for example, have a considerable voltage between the electrodes again following removal of the short circuit connection and the subsequent elapsing of some time. This problem scenario presents a growing problem in analog circuits, such as sample and hold circuits, integrating analog/digital converters and active filters.

The described problem of dielectric absorption in open loop frequency hopping systems can be reduced, by way of example, by using high-grade, expensive loop filter capacitors, which have a low dielectric absorption. Besides the relatively high costs, however, such capacitors have the further drawback of a very large physical form for the same capacitance value. That very large physical form conflicts with the demand for small and lightweight appliances which exists in mobile radio in particular. Even the use of such high-grade loop filter capacitors allows the dielectric absorption to be merely reduced, however, rather than prevent it completely.

U.S. Pat. No. 4,074,209 specifies a phase locked loop having an enlarged modulation bandwidth. In that case, the frequency modulation signal is supplied not just to the phase comparator in the phase locked loop but also to the voltage controlled oscillator. For this purpose, varactors are connected in parallel with the actual resonant circuit. These additional varactors used for modulation are compensated using a bias signal on the basis of the chosen frequency.

SUMMARY OF THE INVENTION

It is accordingly an object of the invention to provide a phase locked loop, which overcomes the above-mentioned disadvantages of the heretofore-known devices and methods of this general type and which phase locked loop can be used in open loop frequency hopping systems and in which it is possible to reduce or to compensate for the described memory effect with little complexity.

With the foregoing and other objects in view there is provided, in accordance with the invention, a phase locked loop for open loop mode, comprising:

a voltage controlled oscillator (VCO) having a first tuning input for a tuning voltage and a signal output for an output signal of tunable frequency;

the voltage controlled oscillator having a frequency-determining capacitance controlled through a second tuning input;

a frequency divider having an adjustable division ratio for the purpose of channel adjustment for the phase locked loop, having an input coupled to the signal output of the oscillator, having an output carrying a frequency-divided output signal and coupled to the first tuning input of the oscillator in a control loop, and having a control input for stipulating the division ratio; and a frequency stipulation unit for programming the frequency of the output signal of tunable frequency connected, firstly, to the control input of the frequency divider for transmitting a frequency word and, secondly, to the second tuning input of the oscillator for transmitting the frequency word such that a change in the tuning voltage upon a change in the frequency word disappears or is as small as possible in order to avoid any frequency drift in an open loop mode of the phase locked loop.

In this case, the subject matter described is based on the principle that the tuning voltage in the control loop is kept substantially constant by virtue of the frequency word for stipulating the nominal frequency or the nominal channel, which frequency word needs to be supplied to the phase locked loop, to be more precise the frequency divider in the control loop, anyway, additionally being supplied to a further tuning input on the voltage controlled oscillator in the phase locked loop.

The subject matter described involves the memory effect of the loop filter capacitors in the phase locked loop being compensated for by means of resonant frequency preselection in the voltage control oscillator.

The second tuning input of the oscillator, to which the frequency word for channel selection is transmitted, is used to reduce the change in the tuning voltage upon a change of channel in the phase locked loop. The characteristic curve of the frequency as a function of the tuning voltage of a voltage controlled oscillator means that, without the second tuning input described, any change of channel between two timeslots, for example in the case of a frequency hopping method, must result in a change in the tuning voltage.

The second tuning input, on the other hand, to which the frequency word for channel selection is transmitted, can be used for compensation such that, in the case of a channel increase, for example, the effective capacitances in the oscillator are reduced, and this means that the tuning voltage can remain almost or completely constant overall, despite the change of channel. A small or disappearing discrepancy in the tuning voltage between two successive timeslots again avoids the memory effect described at the outset for the loop filter capacitors which are usually used in a phase locked loop, however. This significantly reduces the frequency drift in an open loop mode for the phase locked loop.

The present invention is accordingly particularly suitable for direct modulation in open loop systems such as do occur, by way of example, in the case of frequency hopping methods, which operate using timeslots in order to provide full duplex. The small frequency drift during the open mode of the phase locked loop can be achieved in this context using particularly simple means, and therefore inexpensively.

As noted above, the voltage controlled oscillator has a frequency-determining capacitance or capacitor which can be controlled using the second tuning input.

By way of example, voltage controlled oscillators can be in the form of LC resonant circuits, comprising an inductor and a capacitor to form a system which is capable of resonance. In this case, since it is simpler to implement, it is usual for the resonant circuit capacitor to be in controllable form for the purpose of setting the frequency of the resonant circuit. Since voltage controlled oscillators with just one tuning input normally have a tunable capacitor, for example a varactor diode anyway, a further, controllable frequency-determining element, in this case a capacitor, needs to be provided in order to produce the phase locked loop described.

In accordance with a preferred embodiment of the present invention, the phase locked loop comprises a phase detector, one input of which is connected to the output of the frequency divider, a further input of which is connected to a reference frequency source and the output side of which is connected via a loop filter to the first tuning input of the oscillator.

The phase detector, which compares the output signal from the VCO with a reference frequency and provides a signal at the output on the basis of a phase and/or frequency discrepancy in the two signals, said signal at the output being supplied to the first tuning input of the VCO in a control loop, is usually provided in phase locked loops in order to ensure stability for the control loop, like the loop filter. The particular feature in the case of the present subject matter, however, is that capacitors in the loop filter, which are used for integration purposes, for example, show a significantly reduced or no memory effect on account of the tuning voltage, which is largely constant even in the case of channel changes.

In this case, the loop filter can be provided particularly for the purpose of ensuring the stability of the control loop.

The reference frequency source can be in the form of a reference oscillator having a downstream frequency divider.

In another, preferred embodiment of the present invention, the controllable capacitor is a variable capacitance diode.

Variable capacitance diodes are suitable for analog actuation using a voltage which can be taken as a basis for changing the depletion layer capacitance of a reverse-biased diode.

In an alternative, preferred embodiment, the controllable capacitor comprises a plurality of capacitor elements which can each be connected or disconnected.

Besides the analog implementation already described for the controllable capacitor, tuning in discrete steps is also advantageously possible, for which purpose respective series circuits, for example, comprising a capacitor and a switch can be connected in parallel with one another. This forms a capacitor battery. Although such a controllable capacitor cannot be adjusted continuously, it can be implemented particularly easily in an integrated circuit. A capacitor which can be controlled using connectable or disconnectable capacitor elements is used particularly advantageously when the frequency word for stipulating the frequency of the phase locked loop is available as a digital value anyway.

In another, preferred embodiment of the present invention, the capacitor elements are graded on a binary basis. Alternatively the gradation could be such that the relative change in the capacitance is respectively produced in a similar manner to the relative change in the frequency word, that is to say that the capacitor elements are gradated in the same manner as the channels which can be adjusted using the frequency word are gradated with respect to one another. This allows particularly simple and inexpensive actuation of the controllable capacitor with the frequency word for stipulating or programming the nominal frequency of the phase locked loop.

In another, preferred embodiment of the present invention, a digital/analog converter connected between the frequency stipulation unit and the second tuning input is provided for the purpose of actuating the variable capacitance diode with the frequency word from the frequency stipulation unit. Such a D/A converter can convert a signal, available in the form of a three-bit frequency word, for example, for the nominal frequency into an analog output signal for actuating a variable capacitance diode with a control voltage.

In another, preferred embodiment of the present invention, a data bus which connects the frequency stipulation unit to the control input of the frequency divider and to the second tuning input of the oscillator is provided for the purpose of transmitting the frequency word. In this case, the frequency word can comprise three bits, for example.

Other features which are considered as characteristic for the invention are set forth in the appended claims.

Although the invention is illustrated and described herein as embodied in a phase locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
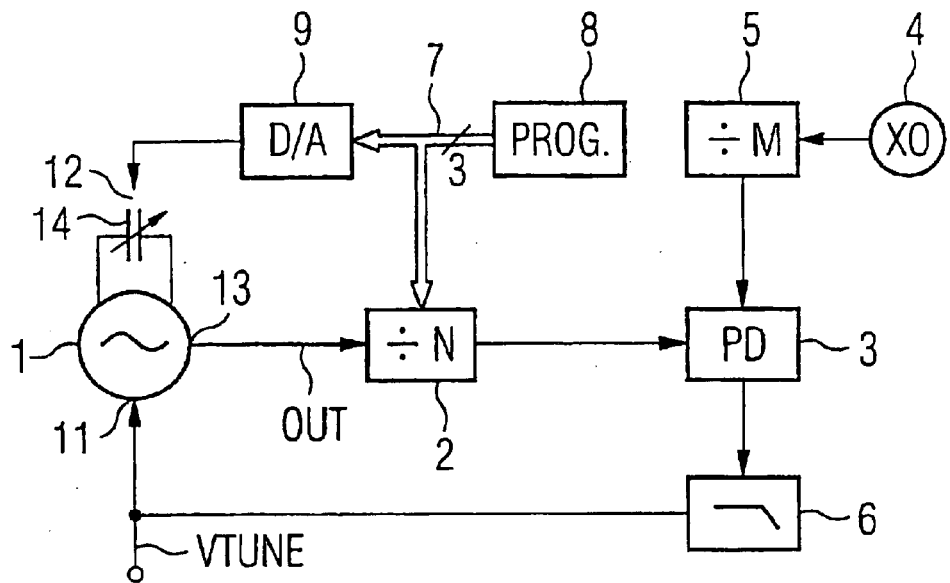
FIG. 1 is a simplified block diagram showing an exemplary embodiment of the present invention.

Referring now to the figures of the drawing in detail and first, particularly, to FIG. 1 thereof, there is shown a voltage controlled oscillator 1 having a first tuning input 11 and having a second tuning input 12. The first tuning input 11 can be supplied with the tuning voltage VTUNE which is obtained in the phase locked loop. At an output 13 of the voltage controlled oscillator 1, it is possible to derive a signal OUT which has a tunable frequency. In this case, the controlled frequency of the output signal OUT at the output 13 is influenced firstly by the signal which is applied to the first tuning input 11 but secondly also by the signal which is applied to the second tuning input 12.

To form a conventional phase locked loop, the output 13 of the oscillator 1 is connected to the input side of a phase detector 3 via a programmable frequency divider 2 which divides the frequency of the oscillator output signal. The phase detector 3 compares the frequency of the frequency-divided output signal from the oscillator 1 with the frequency of a reference signal which is provided by a reference oscillator 4 and has likewise been frequency-divided in a frequency divider 5. The output of the phase detector 3 provides a signal which is dependent on the difference in the input signals described. A loop filter 6 ensuring the stability of the control loop is used to connect the output of the phase detector 3 to the first tuning input 11 of the oscillator 1. In this case, the output side of the loop filter 6 provides the tuning voltage VTUNE for the phase locked loop.

The frequency stipulation for the phase locked loop shown in FIG. 1 can be set by stipulating the division ratio for the frequency divider 2 in the control loop. For this purpose, the frequency divider 2 has a control input connected to a data bus 7 for the purpose of transmitting a digitally coded frequency word. The data bus 7 has a width of 3 bits. To transmit the frequency word, the data bus 7 is connected to the output of a frequency stipulation unit 8 which provides the channel onto which the phase locked loop needs to lock as a nominal value in the frequency word which is to be transmitted by the data bus 7.

The particular feature of the present circuit shown in FIG. 1 is that the PLL frequency word which is provided anyway is additionally supplied not only to the control for the divider ratio of the frequency divider 2 but also to a second tuning input 12 on the voltage controlled oscillator 1. For this purpose, the output of the frequency stipulation unit 8 is not only connected to the control input of the frequency divider 2 via the data bus 7 but is also coupled to the second tuning input 12 of the voltage controlled oscillator 1 by means of the data bus 7. In the present block diagram, the tuning input 12 can be used for the purpose of continuously adjusting a capacitor which is in the form of a varactor diode. In this case, the varactor diode has been provided with the reference 14. Since the varactor diode 14 can be adjusted continuously and accordingly requires an analog voltage signal in order to actuate it, a digital/analog converter 9 is provided for the purpose of coupling the data bus 7 to the control input of the varactor diode 14. The digital/analog converter converts the digital three-bit word applied to its input, which is connected to the output of the frequency stipulation unit 8, into an analog voltage signal at its output, which is connected to the control input of the varactor diode 14.

The resonant frequency preselection for the voltage controlled oscillator 1 by transmitting the frequency word using the data bus 7 is made such that the change in the tuning voltage VTUNE when the frequency word and hence the division ratio in the frequency divider 2 changes disappears or is as small as possible. By way of example, in the event of an increase in the frequency or the channel, the tuning voltage VTUNE would normally also rise, but the present circuit compensates for this rise at least in part by virtue of the effective capacitance value of the varactor diode 14 being reduced on the basis of the frequency word from the frequency stipulation unit 8. The PLL loop filter voltage accordingly remains virtually constant even upon changeover to the new frequency, which means that the present phase locked loop should not expect any voltage or frequency drift in the open loop mode during a transmission timeslot. The improved frequency drift properties mean that smaller and/or less expensive loop filter capacitors can be used in the loop filter 6, these needing to meet lesser demands in terms of the memory effect or being able to have poorer dielectric absorption properties. The circuit complexity for attaining the advantages described is low in this case, as can be seen from FIG. 1.

As an alternative to the described further tuning device, which is in analog form, for the oscillator 1, the further tuning option for the oscillator 1 using the tuning input 12 can also be in digital form, namely through provision of a capacitor battery (shown in FIG. 2) or capacitor bank having a plurality of parallel-connected and binary-gradated capacitor elements instead of the analog-tunable varactor diode 14 from FIG. 1.

Figure 2:
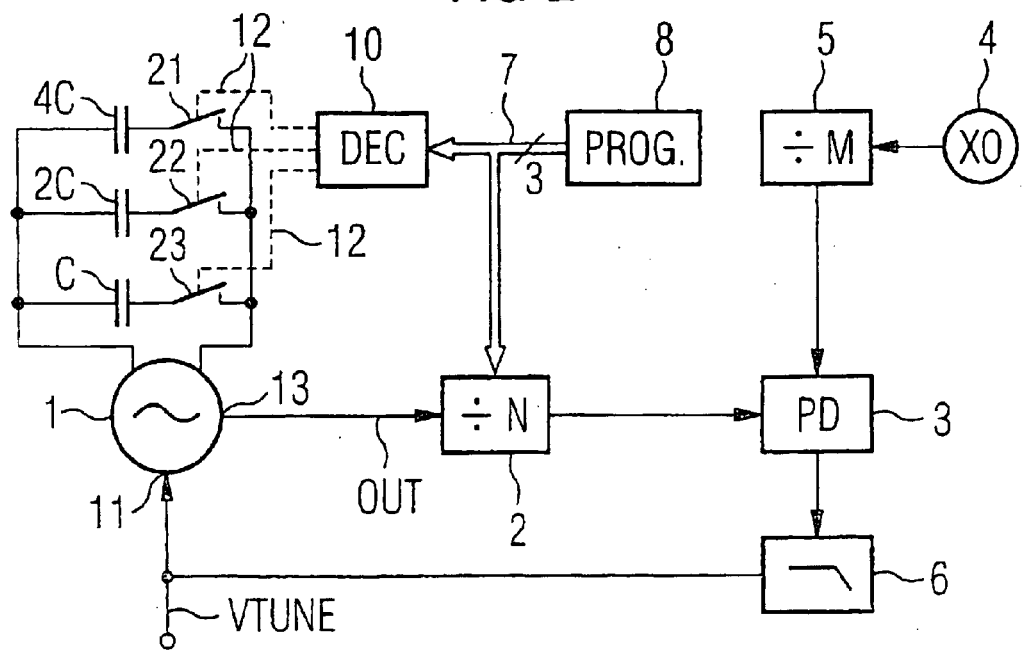
FIG. 2 is a simplified block diagram showing another exemplary embodiment of the present invention.

The capacitor battery C, 2C, 4C in FIG. 2 comprises a parallel circuit containing three paths, which each comprise a series circuit containing a binary-gradated capacitance C, 2C, 4C and a switch 21, 22, 23, which can be in the form of a field effect transistor, for example. In that configuration, the binary-gradated capacitor elements C, 2C, 4C have been provided with the reference symbols C, 2C and 4C according to their gradation, that is to say on the basis of their capacitance ratio with respect to one another. A decoder 10, whose input is connected to the output of the frequency stipulation unit 8 via the data bus 7, makes it possible to convert the frequency word for programming the division ratio for the frequency divider 2 into control signals for the switches 21 to 23, the control inputs of the switches 21 to 23 being connected to outputs of the decoder 10 to form the tuning input 12 of the oscillator 1. The rest of the design of the phase locked loop corresponds to the circuit (already described above with reference to FIG. 1) with a phase detector 3, a loop filter 6, and a reference oscillator 4 having a downstream divider 5 in terms of design and operation and will not be described again at this point.

In addition to the advantages of the phase locked loop which have already been mentioned for FIG. 1, the exemplary embodiment shown in FIG. 2 has the additional advantage of simpler implementation by virtue of it being a particularly simple matter to produce digital or discrete actuation of the discretely gradated capacitors using the frequency word from the frequency stipulation unit 8, which frequency word is available in digital form anyway. In addition, the use of a programmable capacitor, as in FIG. 2, is simpler to implement, particularly with a voltage controlled oscillator in integrated form and integrated phase locked loop, and also has better VCO quality factors.

As an alternative to the binary gradation of the capacitor elements C, 2C, 4C in the capacitor battery shown, as is shown in FIG. 2, it is also possible to gradate the individual, connectable capacitor elements such that any oscillator frequency change corresponding to the capacitor gradation corresponds to a change in a corresponding bit in the PLL frequency word which can be transmitted using the bus 7. A voltage controlled oscillator of such design with capacitor elements gradated in this manner allows a significant improvement in the frequency drift properties with particularly little additional complexity as compared with previous phase locked loops.

In modifications of the exemplary embodiment described which is shown in FIG. 2, it is also possible to dispense with the decoder 10, given suitable programming of the frequency word and given the suitable gradation of the capacitor elements which can be changed over.

The exemplary embodiments described can be used, by way of example, for direct modulation in an open loop method in TDD, time division duplex, mobile radio systems which support frequency hopping methods.

We claim:

1. A phase locked loop for open loop mode, comprising:
a voltage controlled oscillator having a first tuning input for a tuning voltage and a signal output for an output signal of tunable frequency;
said voltage controlled oscillator having a frequency-determining capacitance controlled using a second tuning input;
a frequency divider having an adjustable division ratio for the purpose of channel adjustment for the phase locked loop, having an input coupled to said signal output of said voltage controlled oscillator, having an output carrying a frequency-divided output signal and coupled to said first tuning input of said voltage controlled oscillator in a control loop, and having a control input for stipulating the division ratio;
a loop filter having a memory effect;
a phase detector having a first input connected to said output of said frequency divider, a second input connected to a reference frequency source, and an output connected via said loop filter to said first tuning input of said voltage controlled oscillator; and
a frequency stipulation unit for programming the frequency of the output signal of tunable frequency connected, firstly, to said control input of said frequency divider for transmitting a frequency word and, secondly, to said second tuning input of said voltage controlled oscillator for transmitting the frequency word such that a change in the tuning voltage upon a change in the frequency word disappears or is as small as possible in order to avoid any frequency drift in an open loop mode of the phase locked loop;
said voltage controlled oscillator having resonant frequency preselection to compensate for the memory effect of said loop filter.

2. The phase locked loop according to claim 1, wherein said frequency-determining capacitance is a controllable capacitance formed by a variable capacitance diode.

3. The phase locked loop according to claim 1, wherein said frequency-determining capacitance is a controllable capacitance comprising a plurality of discrete capacitor elements each to be selectively connected or disconnected.

4. The phase locked loop according to claim 3, wherein said plurality of discrete capacitor elements are graded on a binary basis.

5. The phase locked loop according to claim 1, which further comprises a digital/analog converter connected between said frequency stipulation unit and said second tuning input for driving said frequency-determining capacitance with the frequency word from said frequency stipulation unit.

6. The phase locked loop according to claim 5, wherein said frequency-determining capacitance is a controllable capacitance formed by a variable capacitance diode driven by said frequency stipulation unit.

7. The phase locked loop according to claim 1, which further comprises a data bus connecting said frequency stipulation unit to said control input of said frequency divider and to said second tuning input of said voltage controlled oscillator for transmitting the frequency word.

* * * * *